US012557634B2

(12) United States Patent
Beyne et al.

(10) Patent No.: US 12,557,634 B2
(45) Date of Patent: Feb. 17, 2026

(54) INTEGRATED CIRCUIT CHIP INCLUDING BACK SIDE POWER DELIVERY TRACKS

(71) Applicant: IMEC VZW, Leuven (BE)

(72) Inventors: Eric Beyne, Heverlee (BE); Anne Jourdain, Grez-Doiceau (BE); Anabela Veloso, Leuven (BE)

(73) Assignee: IMEC VZW, Leuven (BE)

( * ) Notice: Subject to any disclaimer, the term of this patent is extended or adjusted under 35 U.S.C. 154(b) by 580 days.

(21) Appl. No.: 17/932,582

(22) Filed: Sep. 15, 2022

(65) Prior Publication Data
US 2023/0080522 A1    Mar. 16, 2023

(30) Foreign Application Priority Data

Sep. 16, 2021   (EP) ..................................... 21197018

(51) Int. Cl.
*H01L 23/528*     (2006.01)
*H01L 23/522*     (2006.01)

(52) U.S. Cl.
CPC ...... *H01L 23/5286* (2013.01); *H01L 23/5226* (2013.01); *H01L 2223/544* (2013.01)

(58) Field of Classification Search
CPC .. H10D 84/853; H10D 89/10; H10D 84/0193; H10D 84/038; H10D 84/981;
(Continued)

(56) References Cited

U.S. PATENT DOCUMENTS

| 2002/0020862 A1* | 2/2002 | Livengood ........ H01L 21/76898 |
| | | 257/E21.597 |
| 2010/0032808 A1 | 2/2010 | Ding et al. |

(Continued)

FOREIGN PATENT DOCUMENTS

| EP | 3 324 436 A1 | 5/2018 |
| EP | 3 651 188 A1 | 5/2020 |

(Continued)

OTHER PUBLICATIONS

Extended European Search Report dated Mar. 4, 2022 in European Application No. 21197018.1.

(Continued)

*Primary Examiner* — Galina G Yushina
(74) *Attorney, Agent, or Firm* — Knobbe Martens Olson & Bear LLP

(57) ABSTRACT

An integrated circuit (IC) chip is provided. In one aspect, a semiconductor substrate includes active devices at its front surface and power delivery tracks on its back surface. The active devices are powered through mutually parallel buried power rails, with the power delivery tracks running transversely with respect to the power rails, and connected to the power rails by a plurality of Through Semiconductor Via connections, which run from the power rails to the back of the substrate. The TSVs are elongate slit-shaped TSVs aligned to the power rails and arranged in a staggered pattern, so that any one of the power delivery tracks is connected to a first row of mutually parallel TSVs, and any power delivery track directly adjacent to the power delivery track is connected to another row of TSVs which are staggered relative to the TSVs of the first row. A method of producing an IC chip includes producing the slit-shaped TSVs before the buried power rails.

11 Claims, 9 Drawing Sheets

(58) Field of Classification Search
CPC .............. H10D 86/011; H01L 23/5286; H01L 23/5226; H01L 2223/544; H01L 21/743; H01L 21/76898; H01L 23/528; H01L 23/535

See application file for complete search history.

(56) References Cited

U.S. PATENT DOCUMENTS

| | | |
|---|---|---|
| 2016/0163595 A1 | 6/2016 | Ahn et al. |
| 2017/0256452 A1 | 9/2017 | Pratt et al. |
| 2018/0145030 A1* | 5/2018 | Beyne ............... H01L 21/76898 |
| 2020/0373240 A1* | 11/2020 | Vadi ...................... H01L 23/535 |
| 2021/0098369 A1 | 4/2021 | Kuang et al. |
| 2021/0118798 A1* | 4/2021 | Liebmann ............ H01L 23/5283 |
| 2021/0202384 A1* | 7/2021 | Peng ...................... H10D 89/10 |
| 2022/0367461 A1* | 11/2022 | Chanemougame .......................... H10D 84/0167 |

FOREIGN PATENT DOCUMENTS

| | | |
|---|---|---|
| EP | 3 742 487 A1 | 11/2020 |
| KR | 10-1436553 B1 | 9/2014 |

OTHER PUBLICATIONS

Jourdain et al., "Extreme Wafer Thinning and nano-TSV processing for 3D Heterogeneous Integration", 2020 IEEE 70th Electronic Components and Technology Conference (ECTC), Jun. 2020, pp. 42-48.

Prasad et al., "Buried Power Rails and Back-side Power Grids: Arm® CPU Power Delivery Network Design Beyond 5nm", 2019 IEEE International Electron Devices Meeting (IEDM), Dec. 2019, pp. 19.1.1-19.1.4.

\* cited by examiner

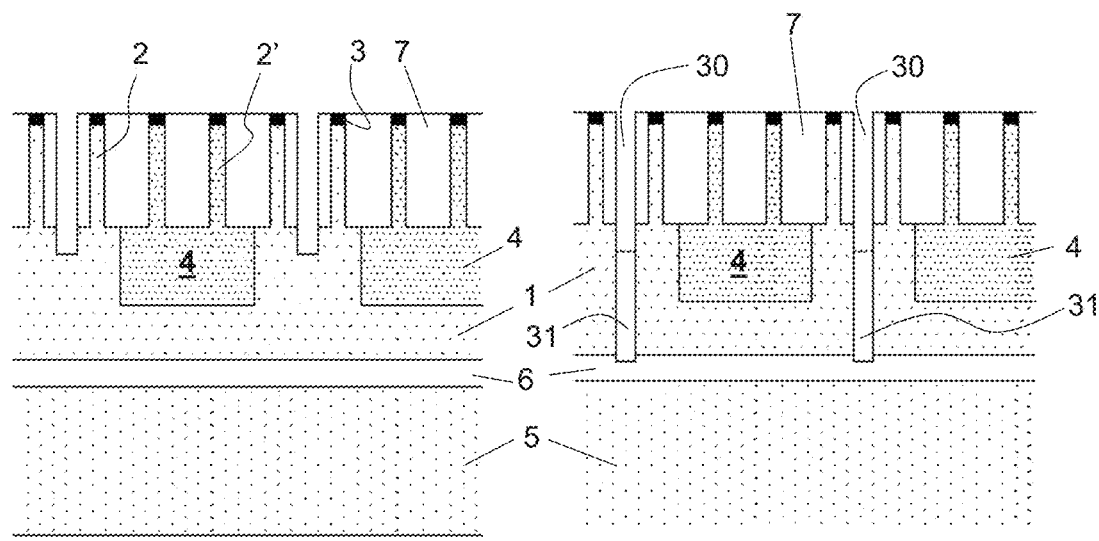
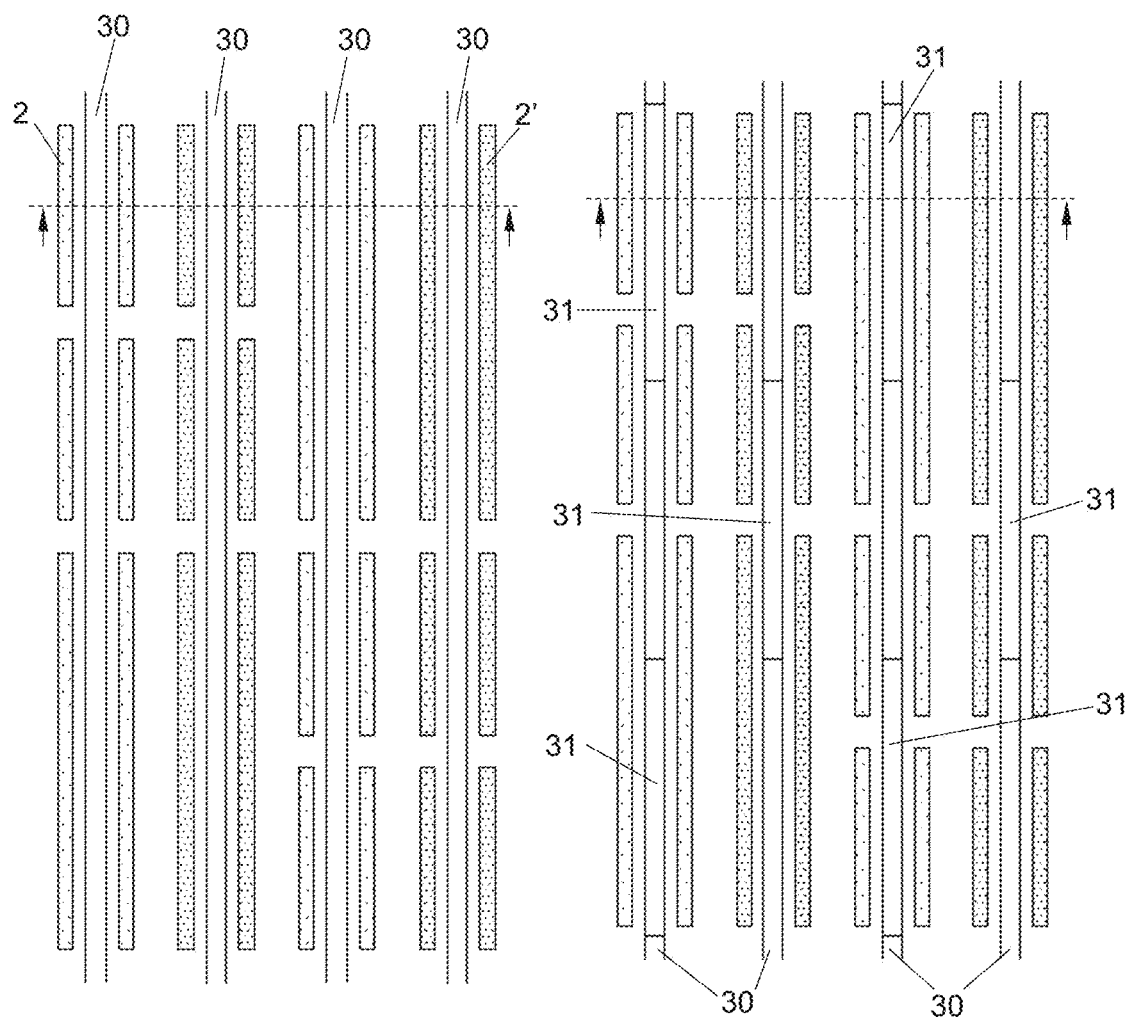
FIG. 3A
FIG. 3B

INTEGRATED CIRCUIT CHIP INCLUDING BACK SIDE POWER DELIVERY TRACKS

CROSS-REFERENCE TO RELATED APPLICATIONS

This application claims foreign priority to European Application No. 21197018.1, filed Sep. 16, 2021, which is incorporated by reference herein in its entirety.

BACKGROUND

Technological Field

The disclosed technology is related to integrated circuit chips, hereafter abbreviated to ICs or IC chips, in particular to the aspect of the delivery of power to the active devices on the chip.

Description of the Related Technology

Semiconductor processing for the fabrication of integrated circuit chips (ICs) continues to evolve towards increasing device-density: higher numbers of active devices (mainly transistors) of ever decreasing device dimensions are placed on a given surface of semiconductor material.

In advanced CMOS devices, electronic circuits are designed and realized as combinations of so-called standard cells: combinations of n-MOS and p-MOS devices organized in rectangular cells bound on two sides by, respectively, a supply and a reference (usually ground) power supply track, coupled to voltages which are usually labeled as Vdd and Vss respectively. These power supply tracks are traditionally connected to metal traces higher in the back end of line (BEOL) metal stack, collecting all the currents from the small pitches at the transistor level to the large pitches at the power and ground level. With continued device scaling, the resistance of the metal tracks at the standard cell level has become a bottleneck for the power supply, resulting in large voltage drops of the supply current and reducing overall potential device performance.

One solution to this problem is to use so-called buried power rails. Basically, the tracks used for Vdd and Vss that are typically horizontal (broad and thin) are now realized vertically (narrow/high) and recessed ("buried") between the fins or nano-sheets onto which the active devices in advanced CMOS standard cells are built.

To further improve the power supply to the devices, it is proposed in European Application Publication No. EP3324436A1 to connect these buried power rails from the back side of the wafer onto which the CMOS processing takes place. After thinning of the wafer, small Through Silicon Via connections (often called "nano"-TSVs) are realized from the thinned wafer back side, contacting the buried power rails. On the back side, parallel power delivery tracks form a pattern of alternating Vdd- and Vss-coupled lines with narrow pitch. As the standard cell is expected to scale down to the 100 nm regime, the TSVs have to be realized without contacting adjacent power rails, setting a limit to the width of these TSVs that takes into account the minimal spacing to the neighbouring Vdd or Vss track and the expected overlay tolerance when patterning the TSVs from the wafer back side. At the same time, the TSV width needs to exceed the width of the power rails. However, the area where the TSV is landing on the Vdd and Vss rails cannot be used for the placement of regular standard cells. Therefore, to minimize the area overhead of the TSVs, the distance between TSVs contacting the same buried rail is made relatively high, which makes it difficult to decrease the contact resistance between the back side Vdd and Vss metal traces and the buried rails. Furthermore in some instances processed wafers exhibit wafer distortions after wafer-to-wafer bonding. This requires extensive use of metrology and litho corrections to result in minimal overlay errors.

Alternative approaches to the above-described "TSV-last" approach have been described in European Application Publication No. EP3651188A1, which describes a "TSV-first" approach for producing the TSVs. A way of reducing or controlling the contact resistance to the back side Vdd and Vss tracks is, however, still desirable. Also, wafer distortions are still limiting the overlay tolerance applied when patterning back side power delivery tracks relative to the TSVs.

SUMMARY OF CERTAIN INVENTIVE ASPECTS

The disclosed technology aims to provide a way of contacting buried interconnect rails that is scalable beyond the above-described approaches. These and other aims are achieved by an integrated circuit chip and a method of producing the IC chip according to embodiments to the disclosed technology. An IC chip, according to the disclosed technology, includes a semiconductor substrate including active devices at its front surface and power delivery tracks on its back surface. The active devices are powered through mutually parallel buried power rails, with the power delivery tracks running transversely with respect to the power rails, and connected to the power rails by a plurality of Through Semiconductor Via connections (TSVs) which run from the power rails to the back of the substrate. According to the disclosed technology, the TSVs are elongate slit-shaped TSVs aligned to the power rails and arranged in a staggered pattern so that any one of the power delivery tracks is connected to a first row of mutually parallel TSVs, and the power delivery track or tracks directly adjacent to the power delivery track is connected to another row of TSVs which are staggered relative to the TSVs of the first row. The staggered arrangement of the TSVs enables a more relaxed overlay tolerance in the patterning steps required to form the power delivery tracks on the back side, while still allowing a very dense interconnectivity of the TSVs, thereby also ensuring that a low resistive path is formed from the power supply to the active devices at the front of the substrate.

The disclosed technology is also related to a method of producing an IC chip, characterized in that the slit-shaped TSVs are produced before the buried power rails, thereby enabling a shorter connection from the TSVs to the active devices.

The disclosed technology is in particular related to an integrated circuit chip, including:
  a semiconductor substrate having a front surface and a back surface,
  active devices on the front surface of the substrate, isolated from each other by an isolation dielectric layer,
  mutually parallel power rails extending in one direction and buried in the substrate and/or in the isolation dielectric layer,
  through semiconductor via connections, hereafter referred to as TSVs, connecting the power rails to the back surface of the substrate,
  power delivery tracks on the back surface of the substrate are oriented transversely with respect to the power rails and connected to the power rails by the TSVs,
wherein:

the power delivery tracks are part of a power delivery network configured to be coupled to a supply voltage and to a reference voltage, the power delivery tracks are configured to be alternately connected to the supply voltage and to the reference voltage, the TSVs are arranged so that the power rails are equally configured to be alternately connected to the supply voltage and the reference voltage, characterized in that:

the TSVs are formed as elongate slit-shaped volumes aligned to the power rails, the TSVs are arranged in a staggered pattern, so that any one of the power delivery tracks is connected to a first row of mutually parallel TSVs, and any power delivery track directly adjacent to the power delivery track is connected to a second row of mutually parallel TSVs which are staggered relative to the TSVs of the first row, the second row being directly adjacent the first row.

According to an embodiment, all TSVs of the staggered pattern have essentially the same length, and the distance between two directly adjacent TSVs which are mutually aligned along their longitudinal direction is essentially the same across the staggered pattern.

According to an embodiment, the distance between two directly adjacent TSVs which are mutually aligned along their longitudinal direction is smaller than or equal to the length of the TSVs.

According to an embodiment, the distance between two directly adjacent TSVs which are mutually aligned along their longitudinal direction is essentially equal to the length of the TSVs, and all the power delivery tracks have essentially the same width and are configured by an essentially constant distance between directly adjacent power delivery tracks.

According to an embodiment, the width of the power delivery tracks is essentially equal to the distance between directly adjacent power delivery tracks.

According to an embodiment, the power rails are at least partially buried in the isolation dielectric layer and not in the substrate.

According to an embodiment, the active devices are fin-based devices or nano-sheet based devices where the power rails run parallel to the fins or to the nano-sheets.

According to an embodiment, the power delivery tracks are essentially perpendicular to the buried power rails.

The disclosed technology is also related to a method of producing an IC chip, the method including the steps of:

providing a device wafer including a semiconductor layer on its upper surface, producing slits in the semiconductor layer, according to the staggered pattern, the slits going through the complete thickness of the semiconductor layer, filling the slits with an electrically conductive material, etching back the conductive material in the slits from the front surface of the semiconductor layer to thereby produce the staggered TSVs and depositing a dielectric material on top of the TSVs, producing active devices including contacts on the front surface of the semiconductor layer, the active devices being isolated from each other by an isolation dielectric layer, the active devices defining at least part of a front end of line portion of the IC chip, by etching trenches from the front side of the device wafer and into the isolation dielectric layer and by filling the trenches with an electrically conductive material, producing the power rails aligned to the TSVs, so that any two directly adjacent power rails are connected respectively to two groups of mutually staggered TSVs, producing electrical conductors on the front side of the device wafer, the conductors connecting the power rails to a plurality of the contacts, producing a back end of line portion of the IC chip on the front end of line portion, flipping the wafer and bonding it to a carrier wafer, thinning the device wafer until the TSVs are exposed on the back surface of the semiconductor layer, producing the power delivery tracks transversely with respect to the TSVs.

According to an embodiment of the method of the disclosed technology, the device wafer includes a base wafer, an etch stop layer on the base wafer, and the semiconductor layer on the etch stop layer, wherein the etch stop function of the etch stop layer is related to stopping an etch process applied during the step of thinning the device wafer.

According to an embodiment of the method of the disclosed technology, the power delivery tracks are essentially perpendicular to the power rails.

BRIEF DESCRIPTION OF THE DRAWINGS

The above, as well as additional objects, features, and advantages of the disclosed technology, will be better understood through the following illustrative and non-limiting detailed description, with reference to the appended drawings. In the drawings like reference numerals will be used for like elements unless stated otherwise. The enclosed figures are illustrating the main features of the disclosed technology. They are not drawn to scale and should not be regarded as technical drawings of real structures.

FIGS. 3A to 3C illustrate steps of an alternative method of producing an IC according to the disclosed technology.

DETAILED DESCRIPTION OF CERTAIN ILLUSTRATIVE EMBODIMENTS

In the following detailed description, an embodiment of an integrated circuit chip according to the disclosed technology is described. The IC chip is produced by processing a CMOS layout of fin field-effect transistor (finFET) transistors arranged in standard cells on a semiconductor device wafer. However, the disclosed technology is not limited to this particular application field. As the disclosed technology is related also to a specific method of producing the chip, this method is described first on a step-by-step basis, with reference to FIGS. 1A to 1L.

Figure 1A:
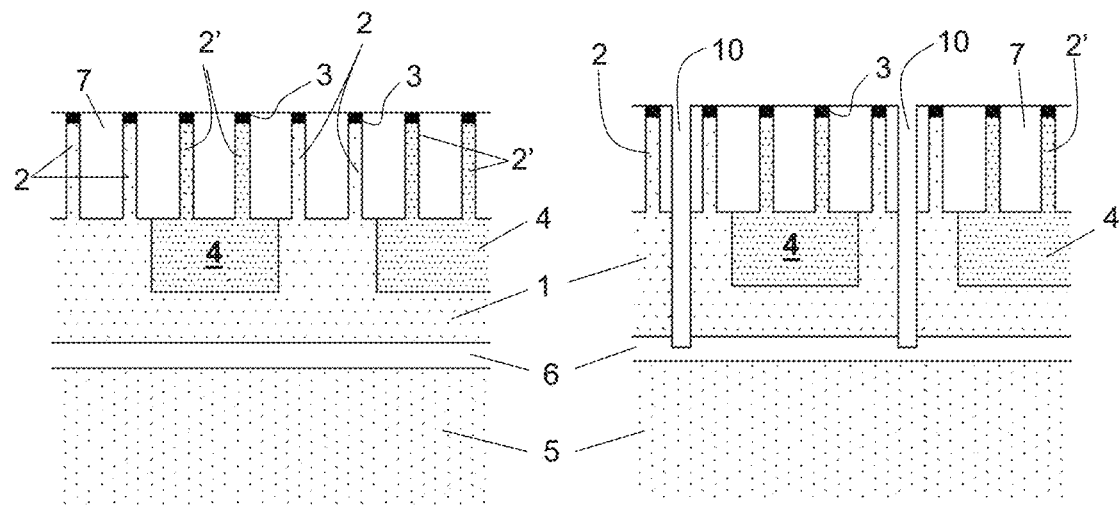
FIGS. 1A to 1L illustrate a number of steps of an embodiment of the method according to the disclosed technology by showing consecutive images of a small portion of a process wafer. Some figures include a section view and a plane view printed under the section view, with the position of the section plane indicated in the plane view. Other figures include only a section view, in which case the section plane is the same as the one indicated in the preceding drawings. Most plane views should not be regarded as horizontal sections nor as top views of the process wafer. The plane views are rather meant to illustrate the position of any component that is relevant for understanding the method steps.

FIG. 1A shows a small portion of a device wafer, including a monocrystalline Si layer 1, into which a number of fins 2 and 2' have been produced by any suitable lithography and etch technique, applying etch masks 3. The width of the fins may be in the order of 10 nm or less. The two different types of hatching indicate different doping types (referred to also by respective references 2 and 2'), typically p-type and n-type doping. In the embodiment shown, the Si layer 1 is a p-type layer, implanted with n-type dopants in consecutive well-areas 4. The well-areas 4 reach about half the depth of the Si layer 1 but could also reach to the back surface of the Si layer. The image is merely a schematic indication of the fact that adjacent p- and n-areas are created on the device wafer. This layout is typically used for producing pMOS and nMOS transistors arranged in multiple standard cells. In this example, alternate pairs of 2 p-type fins 2 and 2 n-type fins 2' are arranged with equal distances between the fins. This could also be groups of more than 2 p-type fins alternating with groups of more than 2 n-type fins. In the plane view of FIG. 1A, it is seen that the fin lengths differ and that the fins are arranged according to a pattern. The pattern shown is a random example of a possible fin pattern.

The Si layer 1 is a monocrystalline top layer of a multilayer device wafer including a base wafer 5, typically a Si wafer, and a thin etch stop layer 6, which could be a SiGe layer. The Si layer 1 (including the fins) can have a thickness less than 1 µm, for example about 500 nm. The etch stop layer 6 may be a SiGe layer of about 50 nm thick for example. Its function as an etch stop layer is to stop the etching of the base wafer 5 for the removal of the base wafer from the back side, as will be explained later in this description. The SiGe layer 6 and the monocrystalline Si layer 1 may be produced on a Si base wafer 5 by suitable techniques, for example but not limited to epitaxial growth methods. An alternative would be to use a silicon-on-insulator (SOI) wafer, wherein the insulator layer plays the part of etch stop layer later in the process. The fins 2, 2' are embedded in a layer 7 of dielectric material. Typically, this is a layer of silicon oxide (SiO2), also referred to as "shallow trench isolation" oxide. This layer is hereafter referred to as the STI layer 7.

Figure 1B:
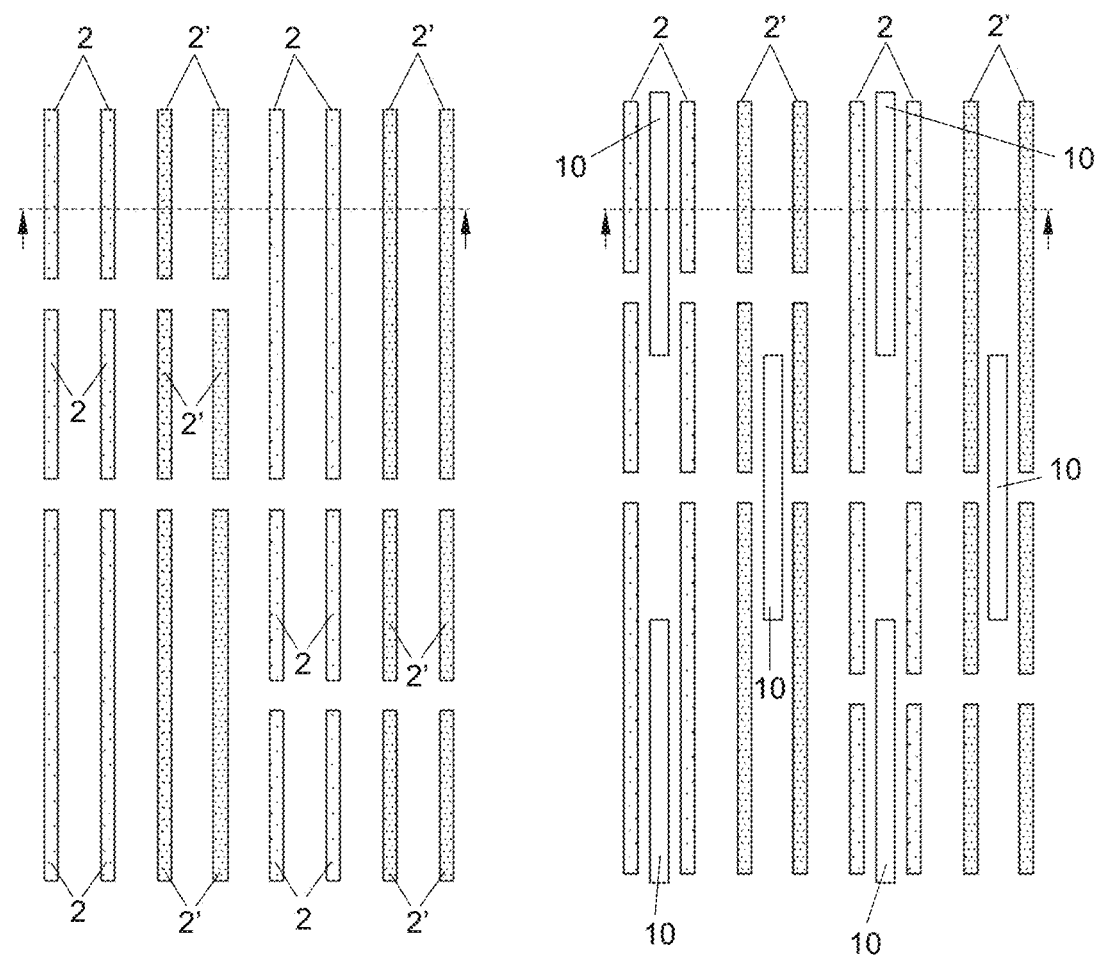

As shown in FIG. 1B, a plurality of slits 10 is produced through the STI layer 7 and through the Si layer 1, stopping in the SiGe layer 6. This is done by lithography and anisotropic etching, using a suitable etching technique. The slits 10 are formed between fins of the same type (n or p), and no slits are formed between any p-type fin and its directly adjacent n-type fin. The slits 10 are formed in a staggered pattern: the slits 10 formed between the n-type fins 2' are shifted in the longitudinal direction of the slits, with respect to the slits 10 formed between the p-type fins 2. This pattern is repeated across a given area of the wafer, as illustrated in the plane view in FIG. 1B.

In the embodiment shown in FIG. 1B, the etching of the slits 10 is stopped inside the SiGe layer 6. The slits 10 could also stop at the upper surface of the SiGe layer 6, or be etched fully through the SiGe layer 36 and slightly into the base substrate 5. In any case, the slits 10 are formed essentially through the complete thickness of the Si layer 1. The width of the slits 10 is shown in the drawings to be in the same order of magnitude as the width of the fins 2,2', but may in reality exceed this width to some degree, while remaining in the order of tens of nanometers. Possibly, the spacing between the fins of the same type may be larger than shown in the drawings, to accommodate the processing of the slits 10. The length of the slits 10 is considerably higher than the width and may be in the order of several hundreds of nanometers. In the embodiment shown, the spacing between each pair of two aligned slits 10 is the same as the length of the slits. It is seen also that in the embodiment shown, two mutually staggered slits 10 do not overlap in their length direction. A limited degree of overlap is, however, allowable as will be described later.

Figure 1D:
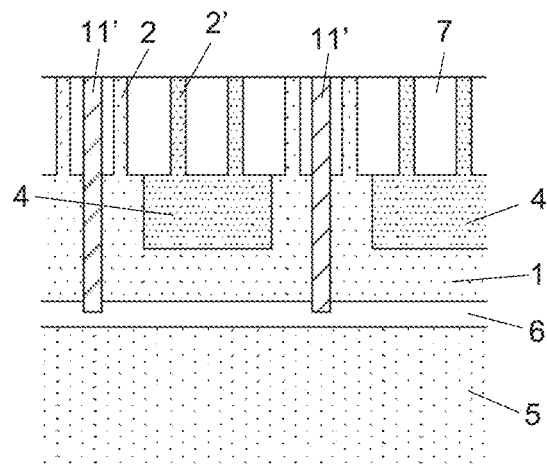
Figure 1D:
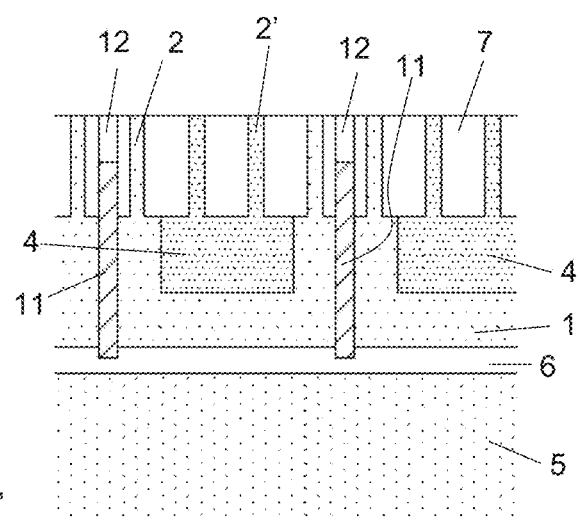
Figure 1C:
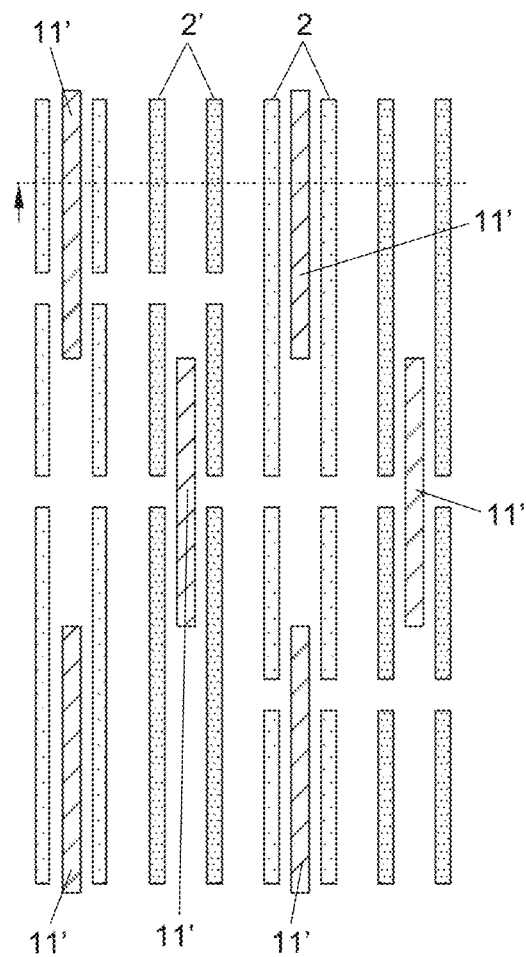

With reference to FIG. 1C, the slits 10 are then filled with an electrically conductive material 11. This involves the deposition of a dielectric liner conformally in the slits 10 and possibly a conformal barrier layer before depositing the conductive material, preferably a metal, for example W, Ru or Mo. The conformal layers are not shown in the drawings. Techniques for producing these layers and for filling the slits 10 with the conductive material can be suitably implemented. The upper surface of the wafer is planarized by a suitable technique, such as CMP (chemical mechanical polishing), removing the etch masks 3 and exposing the conductive material on the upper surface of the wafer, in the form of a staggered pattern of conductive slit-shaped volumes 11'.

As shown in FIG. 1D, the volumes 11' are etched back to thereby form reduced volumes 11, which will play the part of the TSV connections in the final IC, so hereinafter referred to as TSVs 11. The abbreviation TSV is commonly understood as Through Silicon Via, but in the context of the disclosed technology, the term is not limited to silicon, and may be understood as "Through Semiconductor Via".

The areas formed above the TSVs 11 (and limited in length to the length of the TSVs) are then filled with a dielectric material 12, possibly SiO2, followed by another planarization step. Then a number of CMOS front end of line process steps is performed, of which the result is illustrated in a simplified way in FIG. 1E. This is the processing of source or drain (S/D) contacts 13 on the fins 2,2', in accordance with a given layout of standard cells arranged between the TSVs 11. The source or drain contacts 13 are schematically drawn on top of the fins. In reality, the STI layer 7 is etched back to expose the top of the fins, and the S/D contacts are formed thereon by suitable epitaxial techniques. As this technology is not the subject of the disclosed technology however, the drawings have been simplified, showing S/D contacts on top of the fins 2,2' and embedded in a dielectric layer 14. The S/D contacts 13 are also visible in the plane view in FIG. 1E. The depicted distribution of these contacts 13 is not intended to represent a realistic layout, and merely illustrates a random arrangement of S/D contacts relative to the fin arrangement.

Figures 1E, 1F:
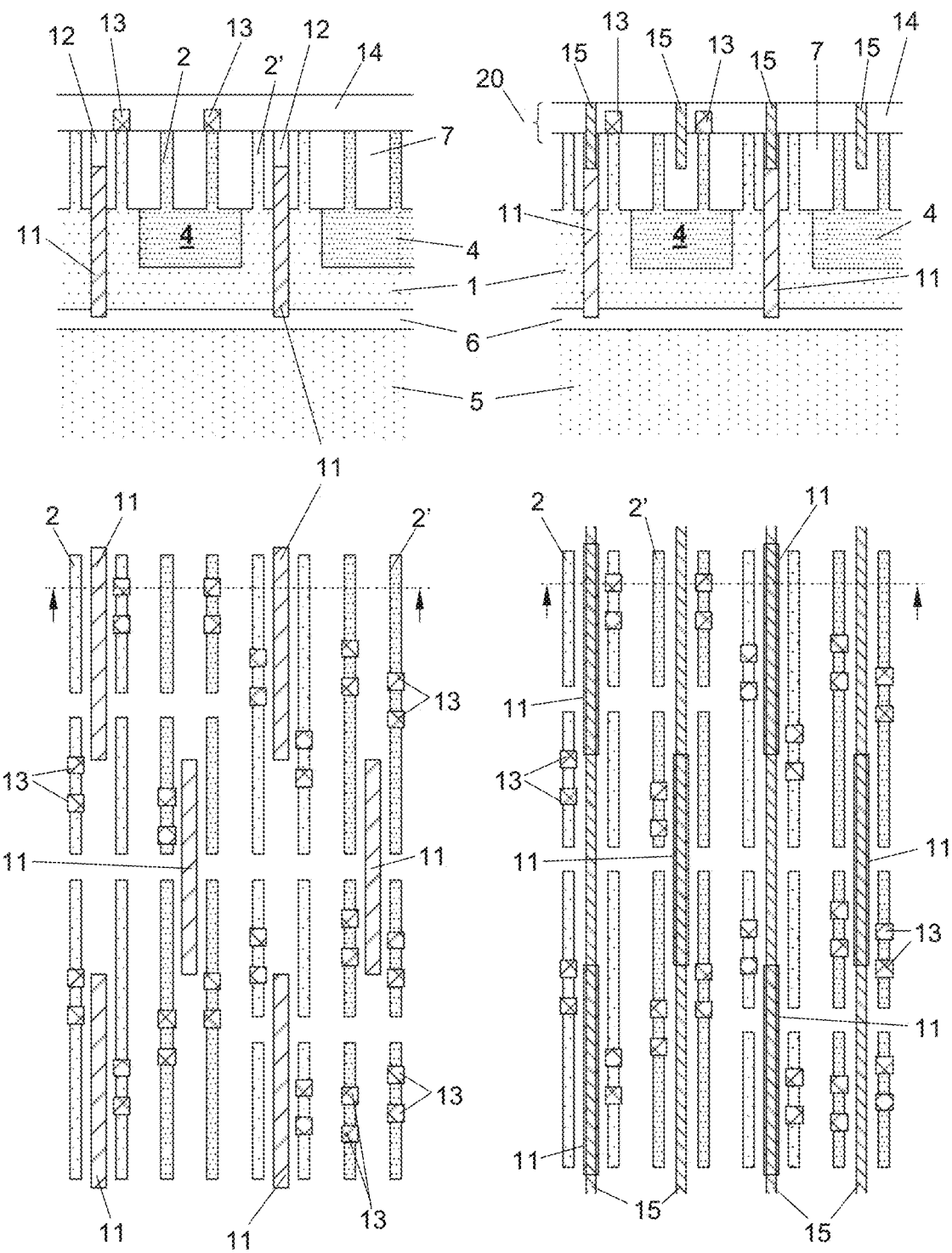

In a characteristic step of the method according to the disclosed technology, buried contact rails 15 are now produced, as shown in FIG. 1F. To this aim, trenches aligned to each line of mutually aligned TSVs 11 are first formed by lithography and etching, through the dielectric layers 14 and 7, until reaching the top of the TSVs 11. These trenches may be somewhat narrower than the TSVs 11, as illustrated in the drawings. The trenches are filled (possibly after conformal deposition of a dielectric liner and barrier layer) with an electrically conductive material, in some cases the same material as used for the TSVs 11. After filling the trenches, the top surface of the wafer is planarized. The result is a set of parallel rails 15, each rail interconnecting a set of TSVs 11 which are mutually aligned along their longitudinal direction. The rails 15 are destined to become connected alternately to the IC's supply voltage (hereafter referred to as Vdd) and to the reference voltage (hereafter referred to as Vss), so that two adjacent rails 15 are configured to supply power to standard cells arranged between a Vdd rail and a Vss rail. The rails are therefore equivalent to the buried power rails described, for example, in European Application Publication Nos. EP3324436A1 and EP3651188A1, where these rails are, however, formed prior to the formation of the S/D contacts and extend deeper into the device wafer, being buried in the Si layer 1 itself, whereas in the embodiment shown in FIG. 1F, the rails 15 are not buried in the Si layer 1, only in the dielectric materials present between two adjacent fins.

Before or after producing the rails 15, further front end of line processing is performed, including the formation of gates and gate contacts in between pairs of source and drain contacts. These elements are not shown in the drawings but can be implemented using any suitable technique. The result is the "front end of line portion" of the IC chip, indicated generally as layer 20 in FIG. 1F and subsequent figures. The '{' is merely an indicative sign of the location of the front end of line (FEOL) portion 20, without meaning to define an exact border. In the FEOL portion 20, the STI layer 7 can isolate active devices from each other.

Figure 1H:
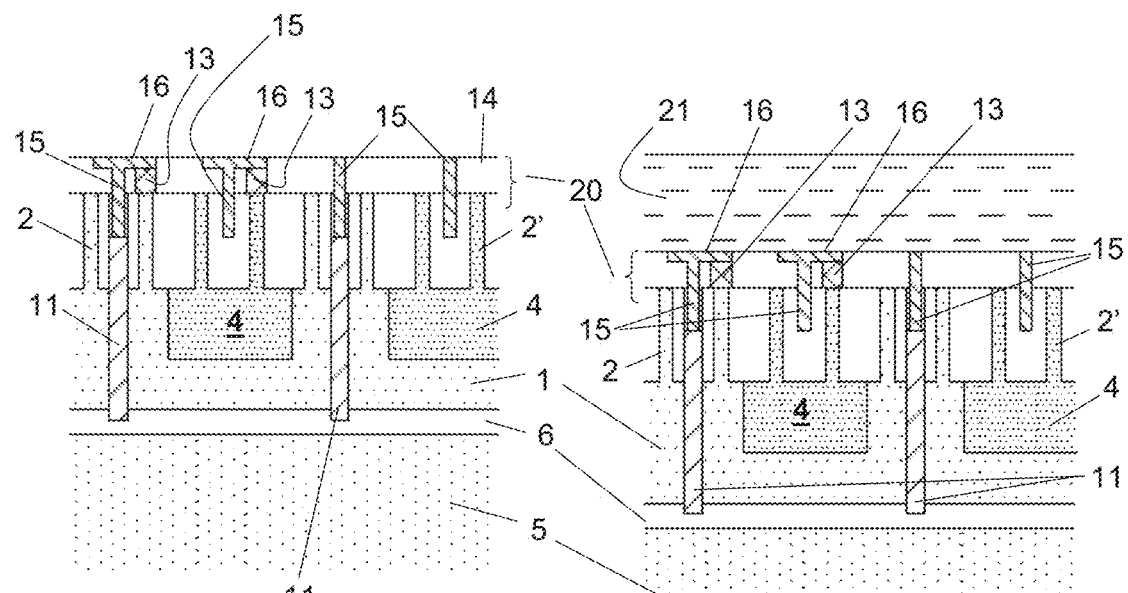
Figures 1G, 1I:
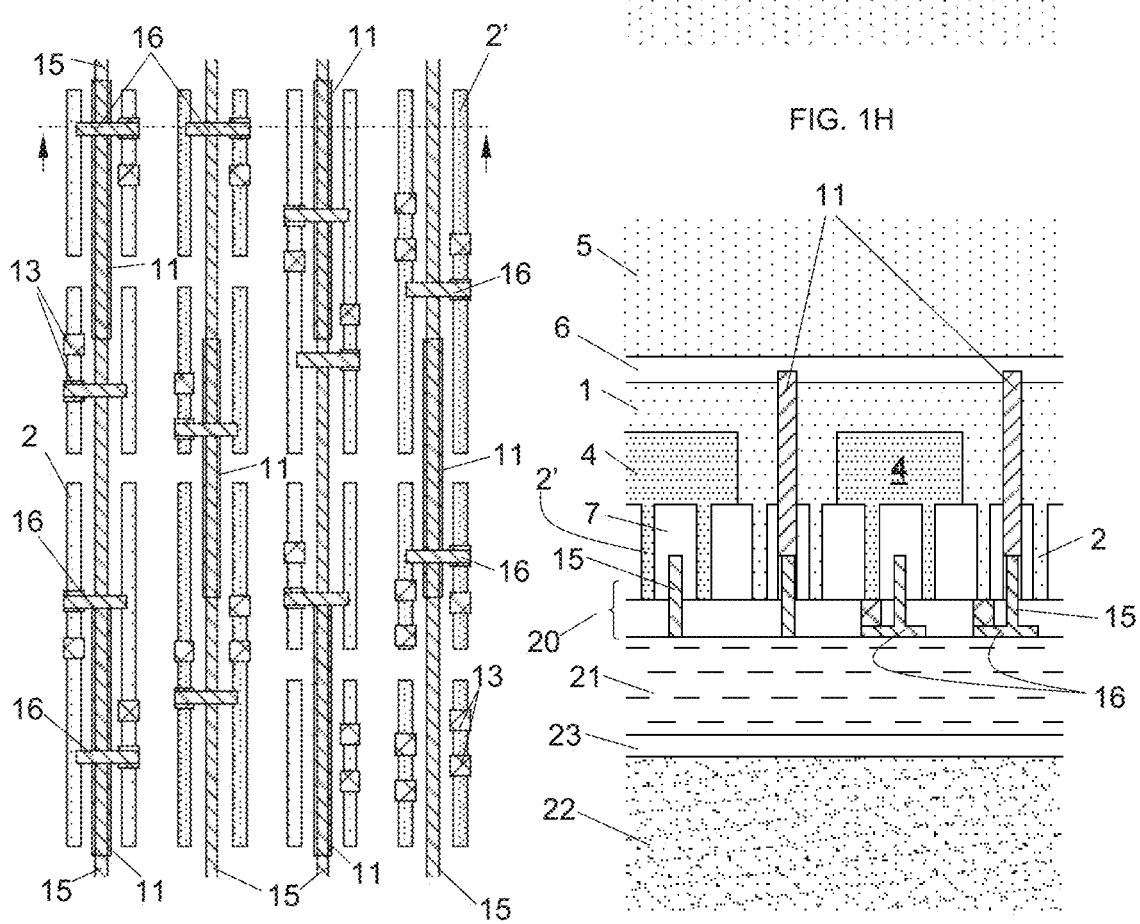
Figure 1J:
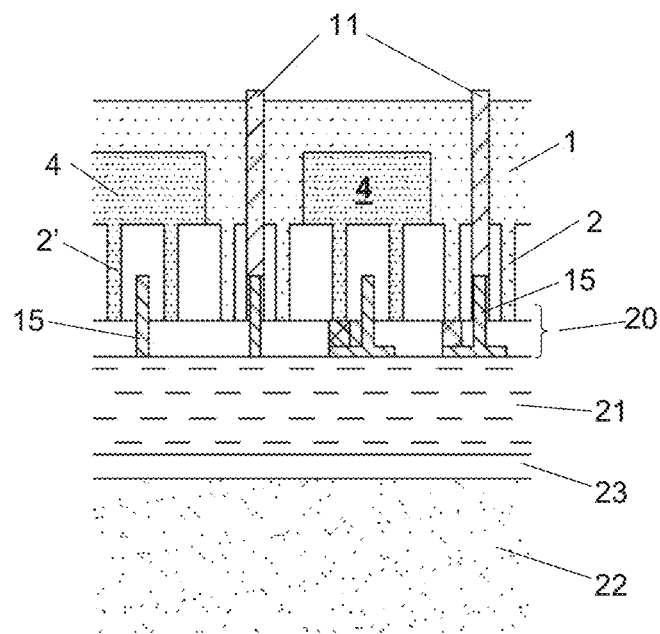
Figure 1J:
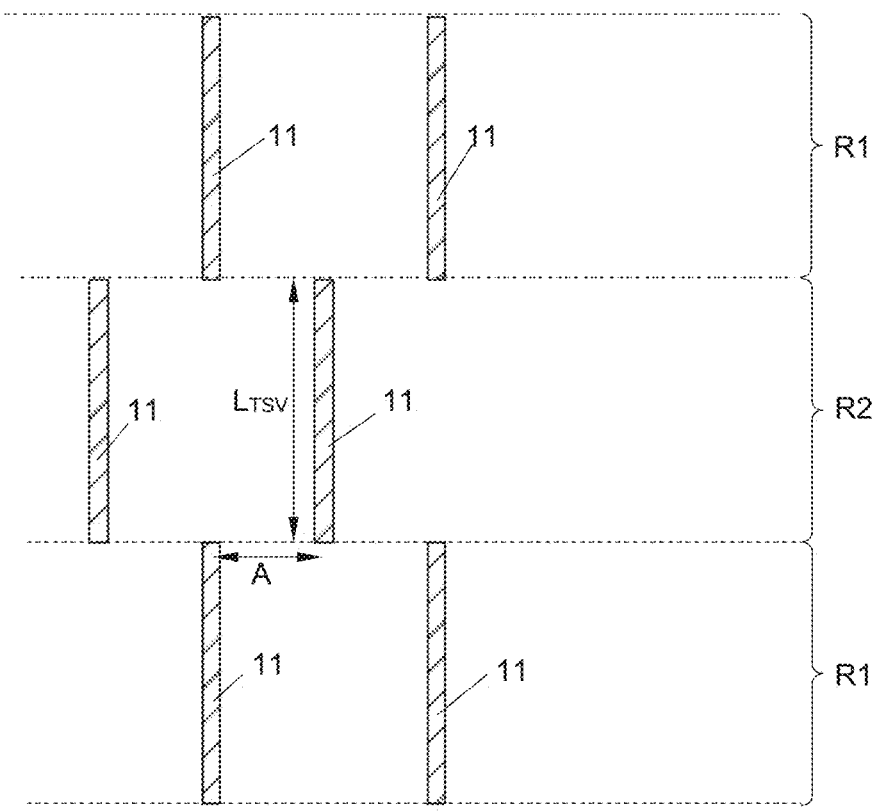

Then the so-called M0 metal layer is formed, see FIG. 1G. This is the formation of metal conductors 16, which connect some of the source or drain contacts 13 to the buried rails 15, in accordance once more with a given standard cell arrangement. As the rails 15 are not buried deep in the Si layer 1, the M0 conductors 16 may be formed so as to contact the upper surface of the rails 15 directly, as shown in the section view of FIG. 1G, by first planarizing the wafer to expose the S/D contacts 13 and the rails 15, followed by a single damascene-type process for producing the conductors 16. This is advantageous compared to the more traditional deep buried rails, which require the formation of a narrow contact via between the rail and the M0 conductor.

After this, as illustrated in FIG. 1H, the back end of line process is performed, resulting in the back end of line (BEOL) portion 21 of the IC. This BEOL portion is a stack of interconnects including several metallization levels (M1, M2, etc.), including a passivation layer on top (not shown). The conductors 16 are indicated as part of the front end of line portion 20 in the drawings. They could, however, be regarded as part of the BEOL portion 21. This distinction has no bearing on the characterizing features of embodiments of the disclosed technology.

Back side processing is now performed, after flipping the wafer and bonding it to a carrier wafer 22, for example, applying dielectric bonding layers 23 (shown as one bonded layer in the drawings) to the carrier 22 and to the BEOL stack 21, as illustrated in FIG. 1I.

The base wafer 5 is removed by a thinning sequence that may include etching and/or grinding steps, ending with a highly selective etch step, for example a wet etch in the case of a SiGe etch stop layer 6, that effectively stops when reaching the SiGe layer 6. Such highly selective etch recipes are effective for the selective etch of Si relative to SiGe as well as for other material combinations. Following this, the etch stop layer 6 itself is removed, resulting in the situation illustrated in FIG. 1G, for example with the TSVs 11 slightly protruding outward from the back surface of the Si layer 1. In one embodiment, the material of the Si layer 1 can be slightly recessed in order to obtain this result. The plane view of FIG. 1G is in this case an actual top view, showing only what is visible on this back surface, namely the staggered pattern of TSVs 11. It is seen that this pattern includes at least one pair of rows R1 and R2 of TSVs 11, extending in the direction perpendicular to the TSVs 11 and the power rails 15 and with the TSVs 11 of the second row R2 in a staggered position relative to the TSVs of the first row R1, that is, the two rows include mutually staggered TSVs. ICs according to the disclosed technology can include many of such "pairs of a first row and a second row of TSVs." In the embodiment shown, a next pair of rows R1, R2 (only R1 is shown) follows under the first pair, and so on. In addition, the TSVs of all the "first rows" R1 are aligned to each other, and the TSVs of all the "second rows" R2 are aligned to each other and shifted with respect to the first rows by the same distance A indicated in FIG. 1G, corresponding to the pitch of the array of parallel power rails 15. The length $L_{TSV}$ of the TSVs can be the same across the complete pattern.

Figures 1K, 1L:
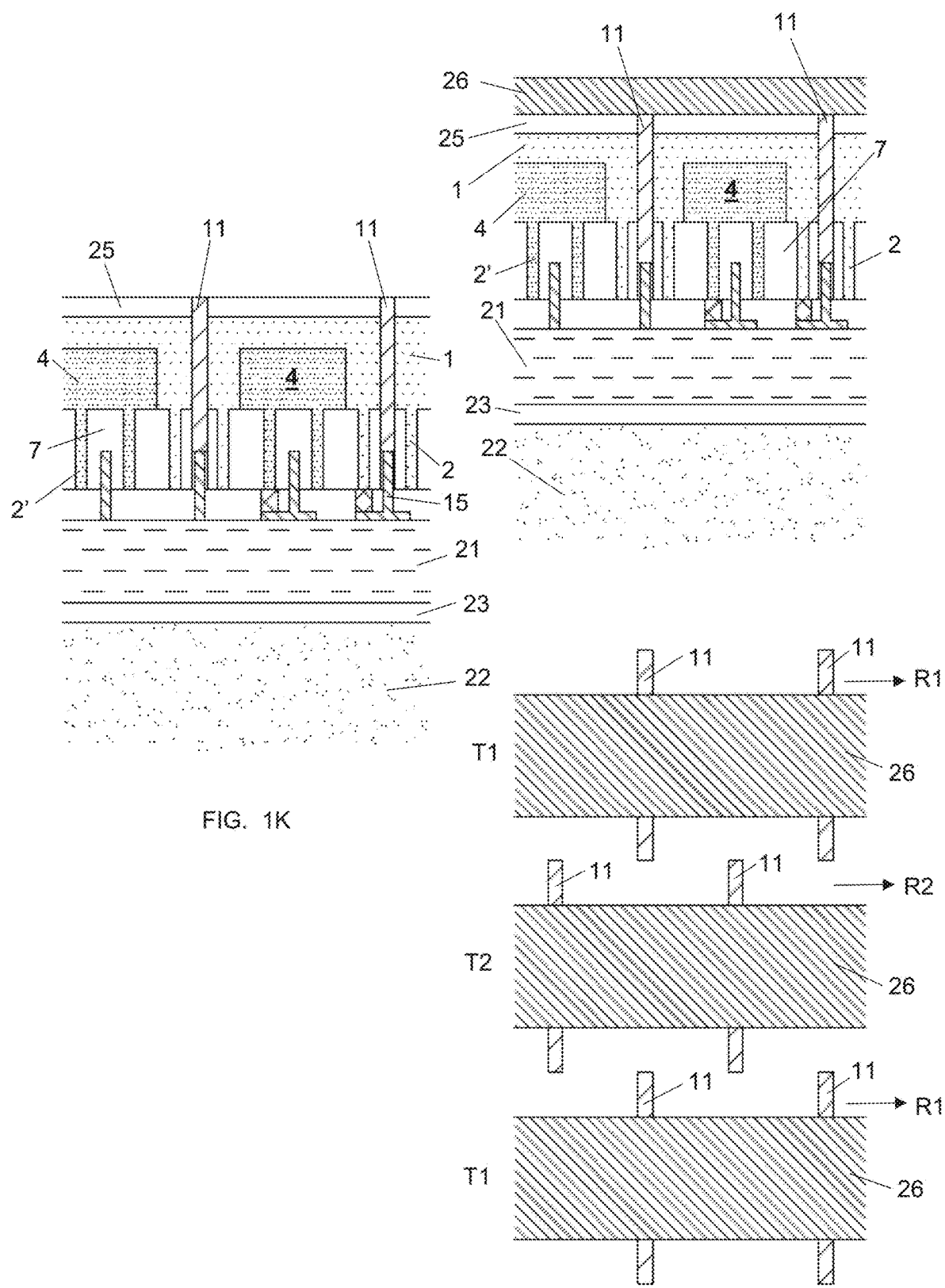

With reference to FIG. 1K, a dielectric layer 25 (for example an oxide or nitride) is then deposited on the back surface of the Si layer 1, followed by a planarization, exposing the TSVs 11, as illustrated in FIG. 1K. Finally, as shown in FIG. 1L, electrically conductive power delivery tracks 26 are formed on the back side by a single damascene process, possibly using copper as the material for the tracks 26. The tracks are arranged transversely, in practice this will be essentially perpendicularly, with respect to the TSVs 11. As shown in the drawings, the tracks 26 are arranged in pairs T1, T2 of mutually parallel tracks, respectively overlapping and contacting two rows R1, R2 of mutually staggered TSVs.

It is thereby seen that the TSVs 11 are arranged in a staggered pattern, configured so that any one of the power delivery tracks 26 is connected to a first row of mutually parallel TSVs 11, and any power delivery track (26) directly adjacent to the power delivery track (that is, the tracks on either side of the first track or on one side only, if the first one is located at the edge of the array of tracks 26) is connected to a second row of mutually parallel TSVs which are staggered relative to the TSVs of the first row, the second row being directly adjacent the first row.

In the finished IC, the tracks 26 are alternately coupled to Vdd and Vss, that is, every T1 coupled to Vdd and every T2 coupled to Vss, to thereby deliver these voltages alternately to the parallel rails 15, and to the standard cells arranged between each pair of rails 15. On top of the tracks 26, further processing is done to produce a full power delivery network on the back side, connected to terminals of the finished IC that are configured to be coupled to external Vdd and Vss supply lines. These processing steps which are similar to BEOL processing are not described here in detail. At the end of the process, the wafer is singulated to form separate IC chips for example by cutting or sawing. The singulated portion of the Si layer 1 is then the semiconductor substrate of the chip, indicated by the reference numeral 1, with active devices mounted on the front surface of the substrate 1, and a power delivery network on the back surface.

The arrangement of the TSVs 11 as slit-shaped volumes of length $L_{TSV}$ aligned to the power rails 15 in a staggered pattern offers several advantages over prior solutions. It is a via-first approach, that is, etching TSVs from the back side is not applied and the TSVs are aligned to the power rails 15, having a width that is essentially equal to or that only slightly exceeds the width of the power rails 15. This reduces or eliminates the problems related to wafer distortion and area overhead, as far as the processing and distribution of TSVs is concerned. In the direction of the rails 15, the distance between two adjacent TSVs can be shortened compared to the TSVs produced by the TSV-last approach, because the area of the TSVs no longer has an influence on the available area for the active devices.

Figure 2A:
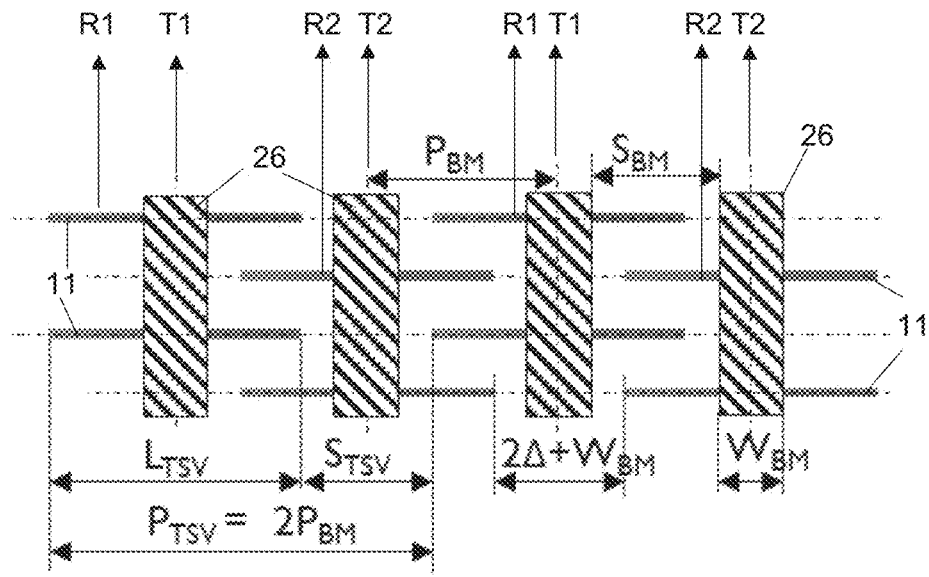
FIGS. 2A and 2B show additional images of staggered patterns of TSVs and their position with respect to back side power delivery tracks in an IC according to the disclosed technology, indicating a number of geometrical parameters of the pattern and of the power delivery tracks.
Figure 2B:
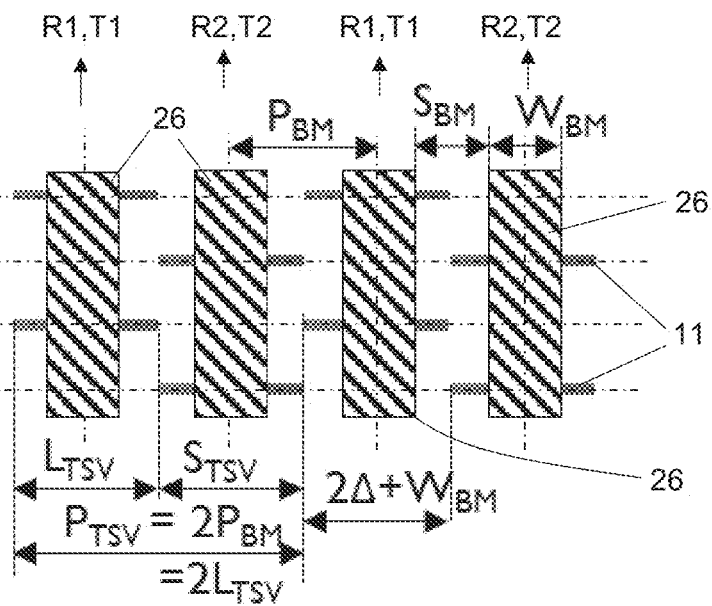

Importantly, the staggered pattern allows to combine a dense front side metal grid (power rails 15 close together), with a coarser back side power track arrangement, with relaxed overlay tolerance for patterning the back side power delivery tracks 26 relative to the TSVs 11. The staggered pattern of TSVs allows adapting the length of the TSVs to a chosen width and pitch of the tracks 26 on the back side. FIGS. 2A and 2B are schematic images of two staggered TSV configurations. In both images, the TSVs 11 are now drawn horizontally and the tracks 26 vertically. The references R1, R2 and T1, T2 are again included to indicate the pairs of rows R1, R2 of TSVs and the corresponding pairs of tracks T1, T2. In the embodiment of FIG. 2A, the length $L_{TSV}$ of the TSVs is larger than the distance $S_{TSV}$ between two adjacent TSVs, so that TSVs of R1 and R2 partially overlap with respect to each other, and with respect to the neighboring row of TSVs. This is allowed, with the condition that a sufficient TSV length can be contacted by each track 26. In the embodiment of FIG. 2B, the TSVs of R1 and R2 do not overlap each other nor the TSVs of neighboring rows, and the length $L_{TSV}$ is equal to the distance $S_{TSV}$. Likewise, the width $W_{BM}$ of the tracks 26 is equal to the distance $S_{BM}$ between two adjacent tracks. This embodiment enables the highest interconnect density. In FIGS. 2A and 2B the back to front overlay tolerance A is the overlay tolerance applied when processing the tracks 26 relative to the staggered pattern of the TSVs. This tolerance ensures that one track (T1 or T2) effectively contacts one row (R1 or R2), without contacting the TSVs of an adjacent row. In the processed IC, the position of the tracks may be shifted within this tolerance with respect to the ideal position shown in the drawings.

Embodiments of disclosed technology demonstrate that a very relaxed overlay tolerance for patterning the back side power delivery tracks 26 can be applied, while still allowing a dense interconnect configuration. The following relations can be derived from the dimensions indicated in FIGS. 2A and 2B:

The spacing $S_{TSV}$ between the TSVs 11 is defined as the sum of the back side metal width $W_{BM}$ and two times the back-to-front overlay accuracy Δ:

$$S_{TSV} = 2\Delta + W_{BM}$$

The TSV length is given by: $L_{TSV} = P_{TSV} - S_{TSV} = 2P_{BM} - S_{TSV}$ with $P_{TSV}$ being the TSV pitch
Therefore: $L_{TSV} = 2P_{BM} - W_{BM} - 2\Delta$, with $P_{BM}$ being the pitch of the back side metal tracks
In the embodiment of FIG. 2B, the TSV length equals the TSV spacing: $L_{TSV} = S_{TSV}$ therefore: $L_{TSV} = P_{BM}$ and $S_{BM} = 2\Delta$
as $S_{BM} = W_{BM}$, it follows that $\Delta = 1/4 P_{BM}$ For example, if the back side tracks 26 have a width of 200 nm and a pitch of 400 nm, and an overlay tolerance of 100 nm is applied for producing these back side tracks 26, the required length of the TSVs is 400 nm in the embodiment of FIG. 2B. Supposing that the width of the TSVs is 30 nm, the resulting volume of the TSVs enables a high conductivity of the TSVs, ensuring—together with the fact that the TSVs are closer together than in the TSV-last approach—a low resistive path from the back side of the IC to the active devices in the FEOL. This is achieved with the relaxed overlay tolerance of 100 nm, whereas in prior methods, a more severe overlay tolerance was required.

Figure 3C:
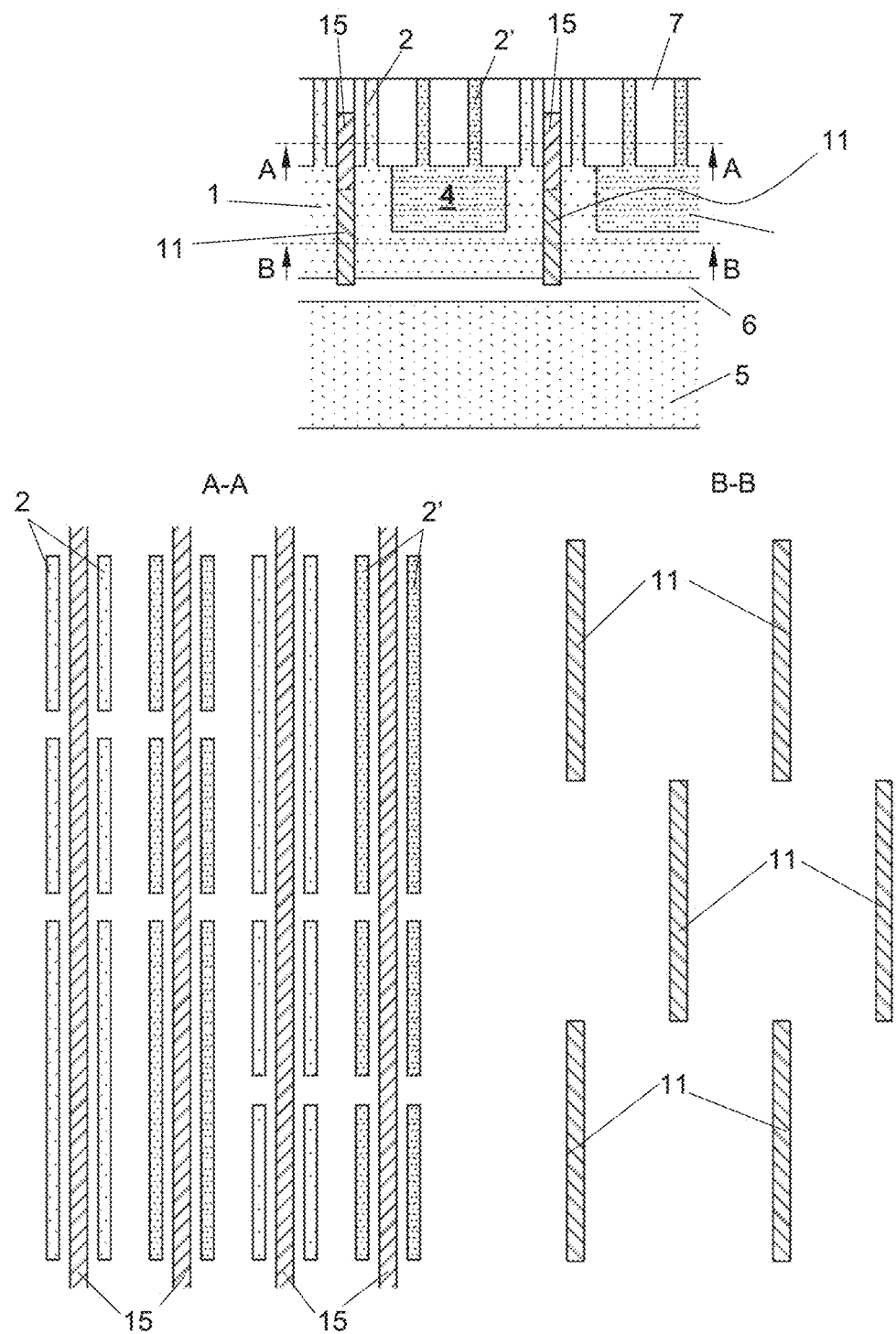

Another way of producing an IC in accordance with the disclosed technology is described hereafter, with reference to FIGS. 3A to 3C. According to this embodiment, and as illustrated in FIG. 3A, trenches 30 are produced at the locations where the buried power rails are to be formed, before producing the TSVs. These trenches 30 are not etched through the complete thickness of the Si layer 1, but the etch is stopped before reaching the back surface of this layer 1. The trenches 30 are formed along the complete length of a given fin pattern (the length being measured in the longitudinal direction of the fins). After this, as illustrated in FIG. 3B, the trenches 30 are further deepened to form elongate slits 31 at the TSV locations by a self-aligned etch, until reaching the back surface of the Si layer 1. The steps of etching the trenches 30 and locally deepening these trenches typically involves substeps of depositing a dielectric liner on the walls and bottom of the trenches 30, planarizing the wafer, forming a lithographic mask defining the TSV locations, removing the liner from the bottom of the trenches, and depositing a liner in the slits 31. These steps are described in more detail in European Application Publication No. EP3651188A1, incorporated herein by reference. After forming a liner also at the bottom of the slits 31, an electrically conductive material is deposited in the slits 31 and in the trenches 30 in a single deposition step (see FIG. 3C), followed by etching back the conductive material in the trenches and depositing a dielectric 12. This results in the formation of buried power rails 15 and TSVs 11, the latter being arranged in the staggered pattern described above. After this, further steps for producing the IC are implemented, and include the formation of the source and drain contacts and further FEOL processing, M0 processing, BEOL processing and back side processing for producing the power delivery tracks 26. One difference with the method described earlier is that the power rails 15 are now buried deeper into the Si layer 1. This may require the formation of narrow via connections between the buried power rails 15 and the M0 conductors 16.

This approach for forming the staggered TSVs is a via-first approach, as basically described in European Application Publication No. EP3651188A1. The advantages of the staggered pattern as such and as described above for example in terms of the overlay tolerances, are however applicable regardless of the method by which the pattern has been produced.

The disclosed technology is not limited to an IC including fin-based devices. The staggered pattern of TSVs can be applied in combination with any type of active devices on the front surface of the Si layer 1. The devices could be nano-sheet based devices, wherein stacks of nano-sheets are processed on the front surface of the Si layer 1, the stacks have a similar profile to the fins 2 and 2' shown in the drawings.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The foregoing description details certain embodiments of the disclosed technology. It will be appreciated, however, that no matter how detailed the foregoing appears in text, the disclosed technology may be practiced in many ways, and is therefore not limited to the embodiments disclosed. It should be noted that the use of particular terminology when describing certain features or aspects of the disclosed technology should not be taken to imply that the terminology is being re-defined herein to be restricted to include any specific characteristics of the features or aspects of the disclosed technology with which that terminology is associated.

Unless specifically specified, the description of a layer being present, deposited or produced "on" another layer or substrate, includes the options of the layer being present, produced or deposited directly on, that is, in physical contact with, the other layer or substrate, and the layer being present, produced or deposited on one or a stack of intermediate layers between the layer and the other layer or substrate.

What is claimed is:

1. An integrated circuit (IC) chip comprising:
   a semiconductor substrate having a front surface and a back surface;
   active devices at the front surface of the semiconductor substrate, isolated from each other by an isolation dielectric layer;
   mutually parallel power rails extending in one direction and buried in the semiconductor substrate and/or in the isolation dielectric layer;
   through semiconductor via connections (TSVs), connecting the power rails to the back surface of the semiconductor substrate; and
   power delivery tracks on the back surface of the semiconductor substrate, oriented transversely with respect to the power rails and connected to the power rails by the TSVs, wherein:
   the power delivery tracks are part of a power delivery network configured to be coupled to a supply voltage and to a reference voltage,
   the power delivery tracks are configured to be alternately connected to the supply voltage and to the reference voltage,
   the TSVs are arranged so that the power rails are equally configured to be alternately connected to the supply voltage and the reference voltage,
   the TSVs are formed as elongate slit-shaped volumes aligned to the power rails, and
   the TSVs are arranged in a staggered pattern, so that when any one of the power delivery tracks is connected to a first row of mutually parallel TSVs, and another power delivery track directly adjacent to the one power delivery track is connected to a second row of mutually parallel TSVs which are staggered relative to the TSVs of the first row, the second row being directly adjacent the first row.

2. The IC chip according to claim 1, wherein the TSVs of the staggered pattern have essentially a same length ($L_{TSV}$), and wherein a distance ($S_{TSV}$) between two directly adjacent TSVs which are mutually aligned along their longitudinal direction is essentially the same across the staggered pattern.

3. The IC chip according to claim 2, wherein the distance ($S_{TSV}$) between two directly adjacent TSVs which are mutually aligned along their longitudinal direction is smaller than or equal to the length ($L_{TSV}$) of the TSVs.

4. The IC chip according to claim 3, wherein the distance ($S_{TSV}$) between two directly adjacent TSVs which are mutually aligned along their longitudinal direction is essentially equal to the length ($L_{TSV}$) of the TSVs, and wherein all the power delivery tracks have essentially a same width ($W_{BM}$) and are configured by an essentially constant distance ($S_{BM}$) between directly adjacent power delivery tracks.

5. The IC chip according to claim 4, wherein the width ($W_{BM}$) of the power delivery tracks is essentially equal to the distance ($S_{BM}$) between directly adjacent power delivery tracks.

6. The IC chip according to claim 1, wherein the power rails are at least partially buried in the isolation dielectric layer and not in the substrate.

7. The IC chip according to claim 1, wherein the active devices are fin-based devices or nano-sheet based devices and wherein the power rails run parallel to the fins or to the nano-sheets.

8. The IC chip according to claim 1, wherein the power delivery tracks are essentially perpendicular to the buried power rails.

9. A method of producing an integrated circuit (IC) chip according to claim 1, the method comprising:
   providing a device wafer comprising a semiconductor substrate on an upper surface;
   producing slits in the semiconductor substrate, according to the staggered pattern, the slits going through the complete thickness of the semiconductor substrate;
   filling the slits with an electrically conductive material;
   etching back the conductive material in the slits from the front surface of the semiconductor substrate to a certain depth thereby producing the staggered TSVs from a remaining conductive material in the slits and depositing a dielectric material on each top of the TSVs;
   producing active devices including contacts at the front surface of the semiconductor substrate, the active devices being isolated from each other by an isolation dielectric layer, the active devices defining at least part of a front end of line portion of the IC chip;
   by etching trenches from the front side of the device wafer to tops of the TSVs, each trench being etched into a dielectric material disposed on a top of a corresponding TSV, and by filling the trenches with an electrically conductive material, producing the power rails aligned to the TSVs, so that any two directly adjacent power rails are connected, respectively, to two groups of mutually staggered TSVs;
   producing electrical conductors on the front side of the device wafer, the electrical conductors connecting the power rails to a plurality of the contacts, producing a back end of line portion of the IC chip on the front end of line portion;
   flipping the wafer with created TSVs and power rails and bonding it to a carrier wafer;
   thinning the device wafer until the TSVs are exposed on the back surface of the semiconductor substrate; and
   producing the power delivery tracks transversely with respect to the TSVs.

10. The method according to claim 9, wherein the device wafer comprises a base wafer, an etch stop layer on the base wafer, and the semiconductor substrate on the etch stop layer, and wherein the etch stop function of the etch stop layer is related to stopping an etch process applied during the thinning of the device wafer.

11. The method according to claim 9, wherein the power delivery tracks are essentially perpendicular to the power rails.

* * * * *